United States Patent
Seler et al.

(10) Patent No.: US 9,583,811 B2
(45) Date of Patent: Feb. 28, 2017

(54) TRANSITION BETWEEN A PLASTIC WAVEGUIDE AND A SEMICONDUCTOR CHIP, WHERE THE SEMICONDUCTOR CHIP IS EMBEDDED AND ENCAPSULATED WITHIN A MOLD COMPOUND

(71) Applicant: Infineon Technologies AG, Neubiberg (DE)

(72) Inventors: Ernst Seler, Munich (DE); Maciej Wojnowski, Munich (DE); Walter Hartner, Bad Abbach (DE); Josef Boeck, Putzbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/453,746

(22) Filed: Aug. 7, 2014

(65) Prior Publication Data
US 2016/0043455 A1 Feb. 11, 2016

(51) Int. Cl.
| | | |
|---|---|---|
| *H01P 5/107* | (2006.01) | |
| *H01P 11/00* | (2006.01) | |
| *H01P 1/04* | (2006.01) | |
| *H04B 5/00* | (2006.01) | |

(52) U.S. Cl.
CPC ............. *H01P 5/107* (2013.01); *H01P 1/042* (2013.01); *H01P 11/002* (2013.01); *H01P 11/003* (2013.01); *H04B 5/00* (2013.01)

(58) Field of Classification Search
CPC ........ H01P 5/107; H01P 1/005; H01P 11/002; H01P 11/003

USPC ....................................... 333/26, 247; 29/600
See application file for complete search history.

(56) References Cited

U.S. PATENT DOCUMENTS

| | | | | |
|---|---|---|---|---|
| 5,235,300 A | * | 8/1993 | Chan et al. | ............. H01L 23/66 257/728 |
| 5,528,074 A | * | 6/1996 | Goto et al. | ............. H01L 23/66 257/664 |
| 5,982,250 A | * | 11/1999 | Hung et al. | ....... H01L 23/49822 257/E23.062 |
| 6,356,173 B1 | * | 3/2002 | Nagata et al. | .......... H01L 23/66 257/664 |
| 2006/0097818 A1 | * | 5/2006 | Camiade et al. | ....... H01P 5/107 333/26 |

(Continued)

OTHER PUBLICATIONS

Geterud, et al., "Lightweight Waveguide and Antenna Components Using Plating on Plastics", 2013 7th European Conference on Antennas and Propagation (EuCAP), IEEE, 1812-1815.

(Continued)

*Primary Examiner* — Benny Lee
(74) *Attorney, Agent, or Firm* — Murphy, Bilak & Homiller, PLLC (57) ABSTRACT

A microwave device includes a semiconductor package comprising a microwave semiconductor chip and a waveguide part associated with the semiconductor package. The waveguide part is configured to transfer a microwave waveguide signal. It includes one or more pieces. The microwave device further includes a transformer element configured to transform a microwave signal from the microwave semiconductor chip into the microwave waveguide signal or to transform the microwave waveguide signal into a microwave signal for the microwave semiconductor chip.

22 Claims, 7 Drawing Sheets

(56) References Cited

U.S. PATENT DOCUMENTS

2011/0299256 A1* 12/2011 Leiba et al. ............ H01L 23/66
361/752

OTHER PUBLICATIONS

Pandey, et al., "Terahertz Pasmonic Waveguides Created via 3D Printing", Department of Electrical and Computer Engineering, Department of Physics and Astronomy, University of Utah, Oct. 21, 2013, vol. 21, No. 21, Optics Express 24423, 1-9.
Schmid, et al., "A 77-GHz FMCW Radar Transceiver MMIC / Waveguide Integration Approach", IEEE, Institute for Communications Engineering and RF-Systems, Christian Doppler Laboratory for Integrated Radar Sensors, Johannes Kepler University, Linz, Austria, 1-4.
Seler, et al., "3D Rectangular Waveguide Integrated in Embedded Wafer Level Ball Grid Array (eWLB) Package", 2014 Electronic Components and Technology Conference, IEEE, 956-962.
Timbie, et al., "Stereolithographed MM-Wave Corrugated Horn Antennas", 2011 IEEE, Department of Physics, Department of Electrical and Computer Engineering, University of Wisconsin, Jodrell Bank Centre for Astrophysics, University of Manchester, 1-3.
Seler, et al. "Chip-to-Rectangular Waveguide Transition Realized in Embedded Wafer Level Ball Grid Array (eWLB) Package", IEEE 2014, 1-4.
Wojnowski, "Embedded Wafer Level Bell Grid Array (eWLB) Technology for Millimeter-Wave Applications", 2011 13th Electronics Packaging Technology Conference, IEEE, 423-429.

* cited by examiner

TRANSITION BETWEEN A PLASTIC
WAVEGUIDE AND A SEMICONDUCTOR
CHIP, WHERE THE SEMICONDUCTOR
CHIP IS EMBEDDED AND ENCAPSULATED
WITHIN A MOLD COMPOUND

TECHNICAL FIELD

This invention relates generally to semiconductor device packaging and microwave waveguides.

BACKGROUND

Microwave device manufacturers are constantly striving to increase the performance of their products, while decreasing their cost of manufacture. A cost intensive area in the manufacture of microwave devices is packaging the microwave semiconductor chip(s). Thus, semiconductor device packages and methods of manufacturing the same at low expenses and high yield are desirable. Further, high power microwave transmission at low losses is desired. The constant effort to provide microwave devices which are smaller, thinner, or lighter and with more diverse functionality and improved reliability has driven a stream of technological innovations in all technical fields involved, in particular in semiconductor chip packaging and waveguide technology.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts that are in different drawings or figures.

DETAILED DESCRIPTION

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a layer or a part formed or located "over" a surface may be used herein to mean that the layer or part be located (e.g. formed, deposited, etc.) "directly on", e.g. in direct contact with, the implied surface. The word "over" used with regard to a layer or part formed or located "over" a surface may be used herein to mean that the layer or part be located (e.g. formed, deposited, etc.) "indirectly on" the implied surface with one or more additional layers or a gap being arranged between the implied surface and the layer or part.

The semiconductor packages described herein may contain one or more microwave semiconductor chips. The microwave semiconductor chip(s) may be of different types, may be manufactured by different technologies and may include, for example, logic integrated circuits, analogue integrated circuits, mixed signal integrated circuits, power integrated circuits, electro-optical circuits, memory circuits, or integrated passive devices (IPD).

The microwave semiconductor chip(s) described herein may be manufactured from specific semiconductor material such as, for example, Si, SiC, SiGe, GaAs, GaN, AlGaN, InGaAs, InAlAs, etc., and, furthermore, may contain inorganic and/or organic materials that are not semiconductors.

The microwave semiconductor chip(s) described herein may include control circuits, microprocessors, memory circuits and/or microelectromechanical components. They may, e.g., include transmitters, receivers, transceivers, sensors, or detectors. In particular, the microwave semiconductor chip(s) described herein may include wireless components such as, e.g., microwave circuitry, e.g. microwave transmitters, microwave receivers, microwave transceivers, microwave sensors, or microwave detectors.

Generally, the microwave frequency region considered herein may range from about 300 MHz (wavelength of about 1 meter) to about 300 GHz (wavelength of about 1 mm). By way of example, the microwave semiconductor chip(s) described herein may include integrated microwave circuitry operating in the frequency range between, e.g., 300 MHz and 300 GHz, more particularly in the frequency ranges between, e.g., 20 GHz and 200 GHz or, e.g., 40 GHz and 160 GHz, and, e.g., at about 50 to 70 GHz, 70 to 90 GHz, and 110 to 130 GHz.

Microwave devices containing one or more semiconductor package each having one or more microwave semiconductor chip are involved. The microwave semiconductor chip(s) may have a horizontal structure. A semiconductor chip having a horizontal structure may have chip electrodes only on one of its two main surfaces, e.g., on its active surface.

The chip electrodes (or contact pads) allow electrical contact to be made with the microwave integrated circuit(s) (e.g. microwave transmitter/receiver/transceiver/detector circuitry, controller circuitry, etc.) included in the microwave semiconductor chip(s). The chip electrodes, e.g. I/O electrodes, ground electrodes, power supply electrodes, microwave frequency electrodes, control electrodes, etc., may include one or more electrode metal layers that are applied to the semiconductor material.

The microwave device described herein includes a waveguide part associated with and, e.g., connected to the one or more semiconductor packages. The waveguide part is configured to transmit a microwave waveguide signal provided by or guided to the semiconductor package(s). The waveguide part may comprise a microwave component such as, e.g., a microwave filter, a microwave antenna, a microwave antenna array, a microwave resonator, a microwave power combiner, or a microwave power divider.

By way of example, the microwave component may comprise or be a waveguide, in particular, e.g., a rectangular waveguide integrated in the waveguide part and shaped to have the desired component functionality. The microwave component may operate in one or more of the above-mentioned frequency ranges.

The waveguide part may comprise or be of one single or a plurality of piece(s) each having, e.g., a wall metallization for microwave transmission. The piece(s) may be formed by different techniques. The piece(s) may, e.g., be of plastic.

By way of example, the waveguide part or the one or more (e.g. plastic) pieces thereof may be formed by 3D printing. That way, a high degree of design variability may be obtained. As design variability of a microwave component comes along with functional diversity, a variety of different device properties and device features may be implemented in the waveguide part by using, e.g., 3D printing techniques for forming the waveguide part and, e.g., the microwave component(s) contained therein.

The semiconductor package may comprise an encapsulating material forming an encapsulant which embeds the microwave semiconductor chip(s).

The encapsulating material may be an electrically insulating material and may comprise or be a thermoset material or a thermoplastic material. A thermoset material may, e.g., be made on the basis of an epoxy resin, a silicone resin or an acrylic resin. A thermoplastic material may, e.g., comprise one or more materials selected from the group of polyetherimide (PEI), polyether-sulfone (PES), polyphenylene-sulfide (PPS), polyamide-imide (PAI), and polyethylene-terephthalate (PET). Thermoplastic materials melt by application of pressure and heat during molding or lamination and (reversibly) harden upon cooling and pressure release.

The encapsulating material may comprise or be a polymer material, e.g. a duroplastic polymer material. The encapsulating material may comprise or be at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

The encapsulating material may be applied over the microwave semiconductor chip(s) by embedding the microwave semiconductor chip(s) into the encapsulating material by, e.g., molding or laminating.

In the first case, i.e. if the encapsulating material is a mold material, various techniques such as, e.g., compression molding, injection molding, powder molding, or liquid molding may be used to form the encapsulant. The mold material may be applied to overmold the microwave semiconductor chip(s) and a temporary carrier on which the microwave semiconductor chip(s) may be placed.

In the second case, i.e. if the encapsulating material is made of a laminate material, the encapsulating material may have the shape of a piece of a layer, e.g., a piece of a sheet or foil that is laminated over the microwave semiconductor chips and over a temporary carrier on which the microwave semiconductor chips are placed. Heat and pressure may be applied for a time suitable to attach the piece of a foil or sheet to the underlying structure. During lamination, the electrically insulating foil or sheet is capable of flowing (i.e. is in a plastic state), resulting in that gaps between the microwave semiconductor chips and/or other topological structures (such as, e.g., a microwave transformer element) on the temporary carrier are filled with the polymer material of the electrically insulating foil or sheet. The electrically insulating foil or sheet may comprise or be any appropriate thermoplastic or thermoset material. In various embodiments, the insulating foil or sheet may comprise or be a prepreg (short for pre-impregnated fibers), that is e.g. made of a combination of a fiber mat, for example glass or carbon fibers, and a resin, for example a thermoset or thermoplastic material. Prepreg materials are typically used to manufacture PCBs (printed circuit boards).

The semiconductor package described herein may be an embedded wafer level package (eWLP). The encapsulant may have a (bottom) first main surface which may, e.g., partly or completely be covered by an electrical redistribution layer (RDL). The RDL may be electrically connected to the microwave semiconductor chip electrode(s). The RDL may include one or more metallization layers. The one or more metallization layers may serve as an electrical interconnect which is configured to electrically connect one or more microwave transformer element(s), which is (are), e.g., also embedded in the encapsulant, to the microwave semiconductor chip(s). Further, the RDL may be structured to form a bottom metal plate of the microwave transformer element(s). It is also possible that the one or more metallization layers of the RDL may be shaped to form an antenna for microwave transmission.

In these specific cases (i.e. if the RDL serves as an electrical interconnect to and/or bottom plate of the microwave transformer element(s) or if a part of the RDL is shaped to form an antenna) or in general, the RDL may, by way of example, be structured to include a microwave transmission line such as, e.g., a coplanar microwave transmission line (CTL) or a microstrip line.

The microwave devices described herein may be used in various applications. By way of example, a microwave device as described herein may be used for telecommunications, industrial, vehicular, scientific or medical purposes. In particular, it may be used in cordless phones, Bluetooth devices, near field communication (NFC) devices, motor vehicles, and wireless computer network. Such applications are, inter alia, covered by the ISM (industrial, scientific and medical) radio bands which are defined, inter alia, by the ITU-R (International Telecommunication Union Radiocommunication Sector) in 5.138, 5.150, and 5.280 of the ITU Radio Regulations, which are incorporated herein by way of reference. For instance, ISM radio bands may be used at frequencies at about 24 GHz, 61 GHz, 80 GHz, and 122 GHz.

Further, microwave devices as described herein may be used for radar (radio detection and ranging) applications. Radar microwave devices are often used in automotive or industrial applications for range finding/range measuring systems. Byway of example, vehicular automatic cruise control systems or vehicular anti-collision systems are operating in the microwave frequency region, e.g. at about 24 GHz or 80 GHz. In all these applications it is important that packaging costs are minimized, microwave radiation losses are low, reliability is high and performance (e.g. resolution, maximum distance measurement range) is high.

Figure 1:
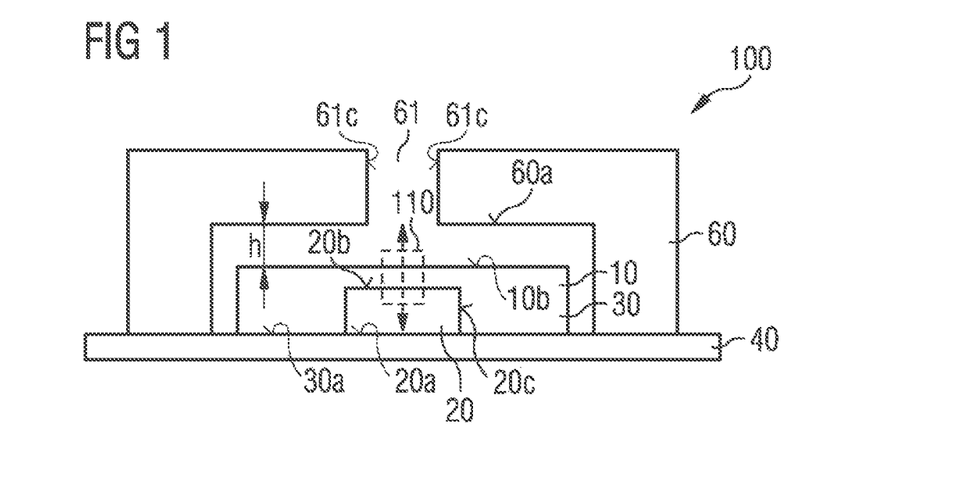
FIG. 1 schematically illustrates a cross-sectional view of an exemplary microwave device including a semiconductor package, a transformer element and a waveguide part connected to the semiconductor package.

FIG. 1 illustrates an exemplary microwave device 100. The microwave device 100 includes a semiconductor package 10. The semiconductor package 10 comprises a microwave semiconductor chip 20. The semiconductor package 10 may further comprise an encapsulant 30 embedding the microwave semiconductor chip 20.

As illustrated in FIG. 1, the microwave semiconductor chip 20 may have a bottom surface 20a and a top surface 20b opposite to the bottom surface 20a. The top surface 20b and side faces 20c of the microwave semiconductor chip 20 may be partly or completely covered by the encapsulant 30. The bottom surface 20a may be exposed at the semiconductor package 10, i.e. may not be covered by encapsulant 30. The bottom. surface 20a may be provided with chip electrodes (not shown in FIG. 1) of the microwave semiconductor chip 20.

The microwave device 100 further comprises a waveguide part 60. The waveguide part 60 is associated with the semiconductor package 10 and configured to transmit a microwave waveguide signal provided by or guided to the semiconductor package 10. More specifically, the waveguide part 60 is provided with at least one waveguide 61, e.g., a rectangular waveguide. The waveguide 61 formed in the waveguide part 60 is a hollow waveguide having electrically conductive (e.g. metallic) walls. The (e.g. rectangular) waveguide 61 may, e.g., propagate transverse electric (TE), transverse magnetic (TM) or transverse electromagnetic (TEM) microwave modes.

The microwave device 100 further includes a transformer element 110 configured to transform a microwave signal generated by the microwave semiconductor chip 20 into microwave waveguide signal received by the waveguide 61 of the waveguide part 60 (TX (transmission) direction) and/or configured to transform a microwave waveguide signal received from the waveguide 61 into a microwave signal provided to the microwave semiconductor chip 20 (RX (receive) direction). The transformer element 110 is depicted in a schematic way in FIG. 1, as a variety of different implementation are available, see further below.

A waveguide as used herein, e.g. a rectangular waveguide, is a non-planar or three-dimensional (3D) structure. Waveguides exhibit high microwave propagation performance characteristics superior to the characteristics of planar 2D microwave transmission lines such as, e.g., microstrip lines or coplanar lines.

The waveguide part 60 may comprise or be of one or more pieces each having, e.g., a waveguide wall metallization for microwave transmission. The waveguide part 60 may comprise or be of plastic. The wall metallization is, e.g., at least at the inner walls 61c of the hollow waveguide 61. The waveguide part 60 may also comprise or be of metal.

The wall metallization may, e.g., be produced by plating-on-plastic (PoP) techniques. By way of example, the wall metallization may, e.g., be formed by sputtering, electroless plating or galvanic plating (i.e. electroplating).

Sputter deposition of a metal allows for metal deposition on all surfaces, including inside blind holes. Electroless plating is a process which does not require an external electrical current to be applied. Electroless plating involves applying an activator to the inside surface (walls 61c) of the waveguide 61. After activation the metal plating is performed. Activation and metal plating may be done in several baths each containing respective substances (activator, metal) to be applied to the walls 61c of the waveguide 61. Further, if the wall metallization is, e.g., generated by electroplating, a seed layer is applied to the surfaces to be plated, the waveguide part 60 may be placed in an electrolyte with metal salts and a current is applied to provide for the metal build-up on the seed layer.

In all processes described above, arbitrary metals may be used such as, e.g., copper, gold, aluminum, etc. Further, in all these processes a high variety of geometries of the hollow waveguide 61, including, e.g., channels, cavities, blind holes, etc. of complex shape may be metal-coated.

The waveguide part 60 comprising one or more pieces (of, e.g., plastic) may be fabricated, e.g., by molding, extrusion, lamination, molding, or 3D printing. In particular, waveguides of arbitrary shape may be formed by 3D printing in one piece or as a combination of pieces. 3D printing, also known as additive manufacturing (AM), may be understood to mean any of various processes of making a three-dimensional object from a 3D model or other electronic data source primarily through additive processes in which successive layers of material are laid down under computer control. An industrial robot, referred to as a 3D printer, is typically used to generate the waveguide part 60 either as one integral piece or in several pieces which, when assembled together, form the waveguide part 60.

Byway of example, stereolithography (SLA) maybe used for fabricating the waveguide part 60. SLA employs UV laser irradiation in an additive manufacturing process (i.e. a 3D printing process), in which a photo-polymer or resin is cured by UV light to build the 3D structure (waveguide part 60) layer by layer.

3D printing (or other processes as described above) may also be used to provide for an (e.g. rectangular) waveguide part 60 having an intrinsic electrical conductivity. Byway of example, plastic composites loaded with an electrically conducting substance such as, e.g. amorphous carbon, may be used as build-up material. In this case, metallization of the walls 61c of the (e.g. rectangular) waveguide 61 or other microwave components included in the waveguide part 60 may be omitted.

As will be described in detail further below, the waveguide part 60 may comprise a microwave component (not shown in FIG. 1) selected from the group of passive components consisting of, e.g., a filter, an antenna, a resonator, a power combiner, and a power divider. The microwave component may be integrated in the waveguide 61, i.e. may itself be formed by a specific portion of the (e.g. rectangular) waveguide 61.

The semiconductor package 10 may be an embedded wafer level packaging (eWLP) package. eWLP is based on embedded device technology, that is the microwave semiconductor chip 20 is embedded in a mold compound or laminate forming the encapsulant 30. eWLP technology may provide for packages having a planar bottom surface composed of the bottom surface 20a of the semiconductor chip 20, the bottom surface 30a of the encapsulant 30 and, if present, a bottom surface of other parts (e.g. inserts) embedded in the encapsulant 30. This planar bottom surface of the eWLP package allows to use planar technologies for applying an electrical interconnect, e.g. an electrical redistribution layer (RDL—not shown in FIG. 1) by using thin-film techniques. Such electrical interconnect or RDL enables the realization of low-loss transmission lines for microwave transmission. By way of example, a coplanar waveguide (CPW) for single-ended signals or coplanar strips (CPS) for differential signals can be formed in a single-layer RDL. If a double-layer RDL is used, a thin-film microstrip line (TFMSL) and various specialized microwave transmission lines are available, e.g., quasi-CPW with elevated signal conductor, etc.

As will be described in detail further below, an eWLP package may further be equipped with one or more passive microwave components (not shown in FIG. 1), which may be formed directly within the encapsulant 30 or may be formed in an insert (not shown in FIG. 1) which is embedded in the encapsulant 30 similar as the microwave semiconductor chip 20 is embedded in encapsulant 30. Such microwave component may be electrically connected to the microwave semiconductor chip 20 by the electrical interconnect, e.g., microwave transmission line(s) formed by the RDL.

Further, the RDL (not shown in FIG. 1) may be used to electrically connect the semiconductor package 10 to an internal or external carrier 40. The carrier 40 may, e.g., be a microwave device carrier on which both the semiconductor package 10 and the waveguide part 60 are mounted or may, e.g., be an external assembly board on which these parts (semiconductor package 10 and waveguide part 60) are assembled.

The semiconductor package 10 may, e.g., be an eWLB (embedded wafer level ball grid array) package. An eWLB package is a specific type of an eWLP package. All the above disclosed features of eWLP packages also apply to eWLB packages.

Figure 2:
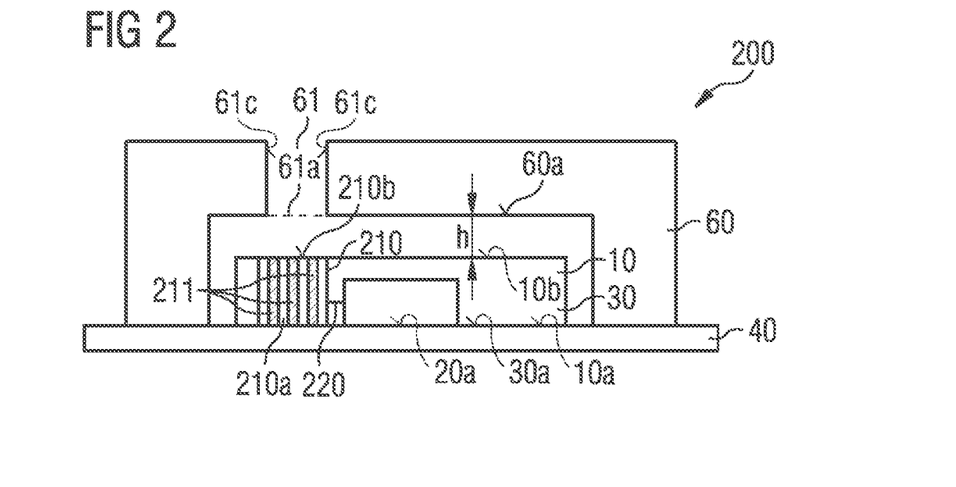
FIG. 2 schematically illustrates a cross-sectional view of an exemplary microwave device including a semiconductor package containing a transformer element and a waveguide part connected to the semiconductor package.

There are many possibilities of combining the semiconductor package 10 comprising the microwave semiconductor chip 20 with the 3D waveguide part 60. Referring to FIG. 2, an exemplary microwave device 200 is illustrated. In microwave device 200, the transformer element 110 of FIG. 1 is, e.g., implemented by a transformer element 210 which is partly or completely embedded in the encapsulant 30.

The transformer element 210 may be electrically coupled to the microwave semiconductor chip 20 by an electrical interconnect 220. It is to be noted that the electrical interconnect 220 is depicted in FIG. 2 in a schematic representation. The electrical interconnect 220 may, e.g., be partly or completely embedded in the encapsulant 30. According to another possibility, as will be illustrated further below, the electrical interconnect 220 may be formed in an electrical redistribution layer (RDL) located at a bottom surface of the semiconductor package 10.

The transformer element 210 may be located in the encapsulant 30 in a spaced-apart relationship to the microwave semiconductor chip 20. According to one possibility, the transformer element 210 may be a pre-fabricated part or insert which may have been embedded in the encapsulant 30 by, e.g., using similar or the same techniques as used for embedding the microwave semiconductor chip 20 in the encapsulant 30. According to other possibilities, the transformer element 210 may be generated directly in the encapsulant 30 after forming (e.g. molding, laminating, etc.) the encapsulant 30. In this case, the transformer element 210 may be generated in the encapsulant 30 by using similar processes as employed for generating substrate integrated waveguide (SIW) components. In particular, vias may be created directly in the encapsulant. By way of example, holes may be created in the encapsulant 30 by laser-drilling or micro-drilling, and their metallization to form vias may be generated by using, e.g., conductive paste or metal plating.

The transformer element 210 may have a bottom surface 210a and a top surface 210b. In some embodiments the bottom surface 210a may be formed by a metal plate (not shown in FIG. 1). In other cases, a metal layer of a RDL may serve as a bottom metallization of the transformer element 210. A planar bottom surface 10a of the semiconductor package 10 may comprise or be composed of the bottom surfaces 20a, 30a, and, e.g., 210a, which may be covered by the RDL.

The transformer element 210 may be configured to transform a transverse electromagnetic (TEM) mode of the microwave transmission line forming the electrical interconnect 220 to a transverse electric (TE) mode of the waveguide 61. The waveguide 61 may be aligned to the transformer element 210 to provide for an effective coupling of the microwave waveguide signal to the waveguide 61. The transformer element 210 as illustrated in FIG. 2, if acting as a transmitter, may, e.g., also be referred to as a launcher, e.g. a $TE_{01}$ launcher, if it is used to radiate the $TE_{10}$ mode into the waveguide 61.

The transformer element 210 may include at least one electrically conducting wall structure. In FIG. 2 the electrically conducting wall structure may be an "open structure" comprising, e.g., a row of conducting vias 211 formed either directly in the encapsulant 30 or in an insert implementing the transformer element 210. In other examples, the electrically conducting wall structure may, e.g., comprise a metallization on a wall of such an insert. In this case, the electrically conducting wall structure may be configured as a grid or mesh of conducting strips formed on the side walls of the insert. Further, the conducting wall structure may be formed as a continuous metallization on the side walls of the insert.

The electrical interconnect 220 used to electrically couple a microwave signal provided by the microwave semiconductor chip 20 (Fig. 1) to the transformer element 210 (Fig. 2) (TX, direction, i.e., transmit direction)) or a microwave signal provided by the transformer element 210 to the microwave semiconductor chip 20 (RX direction i.e., receive direction) may have short length. By way of example, the length of the electrical interconnect 220 may be equal to or less than 2 mm, 1 mm, 0.5 mm, or 0.2 mm. The shorter the length of the electrical interconnect 220, the lower are the propagation losses of microwave transmission across the electrical interconnect 220.

As illustrated in FIGS. 1 and 2, the top surface 10b of the semiconductor package 10 may be spaced apart from a bottom surface 60a of the waveguide part 60 located over the semiconductor package 10 by a distance h. In FIG. 2, distance h may also be defined as the distance between the top surface 210b of the transformer element 210 and the entrance plane 61a of the waveguide 61. The distance h in Fig. 1 may be equal to or smaller than 500 μm, 400 μm, 300 μm, 200 μm, 100 μm, 50 μm, 20 μm. The smaller the distance h the better is the coupling between the transformer element 210 and the waveguide 61. The waveguide part 60 may thus be located either in direct contact to the semiconductor package 10 top surface 10b or it may be the case that a small gap (i.e. distance h) may be needed, e.g., in order to compensate for CTE (coefficient of thermal expansion) differences between the material of the semiconductor package 10 and the (e.g. plastic) material of the waveguide part 60. In this connection, it is to be noted that the CTE of the material of the semiconductor package 10 and the CTE of the material of waveguide part 60 may be different from each other equal to or less than 10%, 25%, 50%, 75%, or 100% of the respective material having the smaller CTE.

Figure 3:
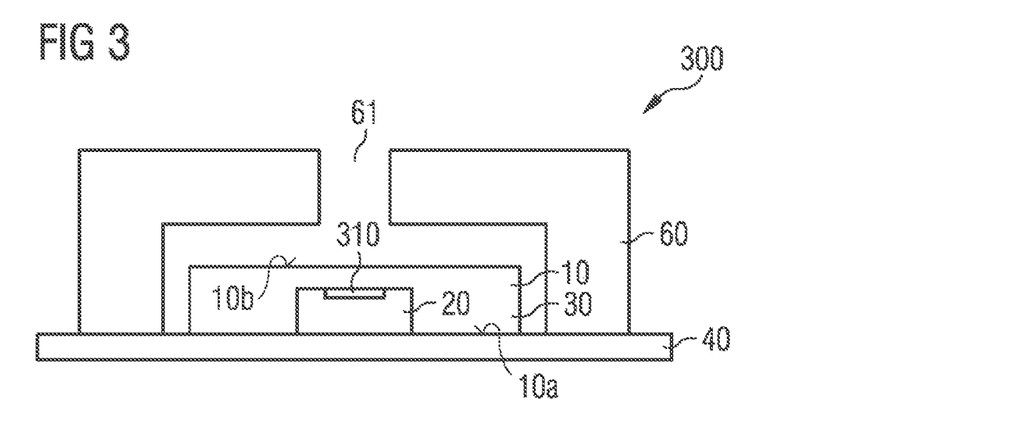
FIG. 3 schematically illustrates a cross-sectional view of an exemplary microwave device including a semiconductor package containing a microwave semiconductor chip equipped with an on-chip antenna and a waveguide part connected to the semiconductor package.

FIG. 3 illustrates an exemplary microwave device 300. The microwave device 300 may be similar to the microwave devices 100 or 200 of Figs. 1 and 2,respectively, and reference is made to the above description to avoid reiteration. In semiconductor device 300, however, the transformer element 110 of Figs. 1 and 2, is designed as an on-chip antenna 310. The on-chip antenna 310 is implemented within the microwave semiconductor chip 20, e.g. in one of the internal metal layers of the microwave semiconductor chip 20 structured during chip fabrication. By way of example, the on-chip antenna 310 may be formed in the top metal layer of the microwave semiconductor chip 20. On-chip antennas 310 may be specifically efficient in a frequency range equal to or greater than 80 GHz, 100 GHz, 120 GHz, 140 GHz, 160 GHz, 180 GHz, or 200 GHz. Again, the semiconductor package 10 may be aligned to the waveguide part 60 such that the transformer element 110 (i.e. the on-chip antenna 310) may be located in a vertical protection under the bottom opening of the waveguide 61.

Figure 4:
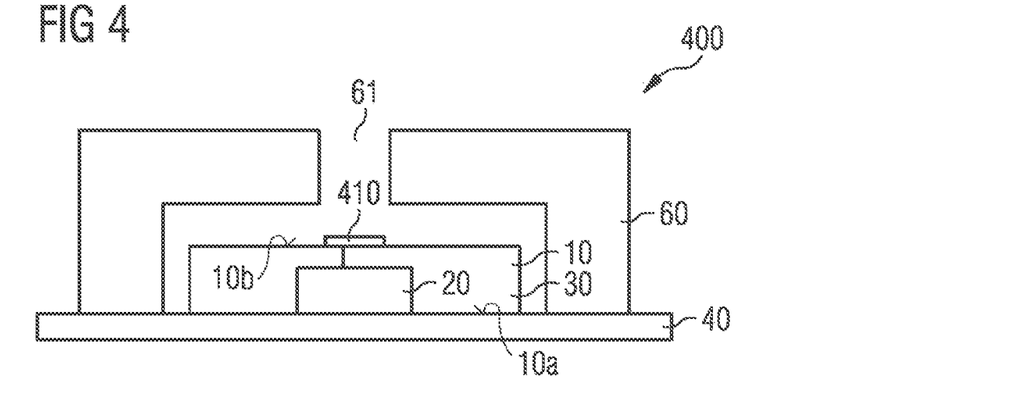
FIG. 4 schematically illustrates a cross-sectional view of an exemplary microwave device including a semiconductor package equipped with an off-chip antenna and a waveguide part connected to the semiconductor package.

FIG. 4 illustrates an exemplary microwave device 400. The microwave device 400 may be similar to the microwave device 300 illustrated in FIG. 3 except that the transformer element 110 is implemented by an off-chip antenna 410 rather than by an on-chip antenna 310 as in Fig. 3. The off-chip antenna 410 may be provided as a structured metal layer on the top surface 10b of the semiconductor package 10. In other embodiments, the off-chip antenna 410 may be formed by a structured layer of an RDL (not shown in FIG. 4) arranged at the bottom surface 10a of the semiconductor package 10, see, e.g., FIG. 6.

Figure 5A:
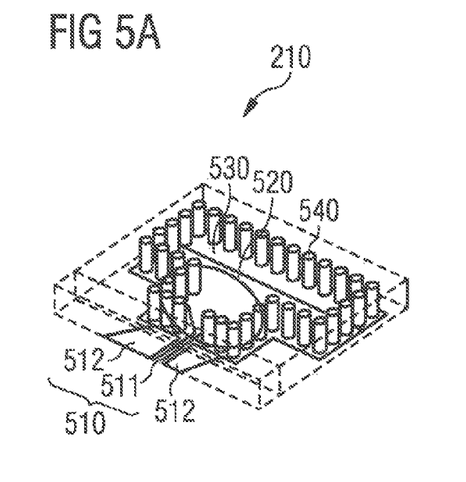
FIGS. 5A and 5B schematically illustrate a perspective view and a plan view of an exemplary transformer element included in a semiconductor package.
Figure 5B:
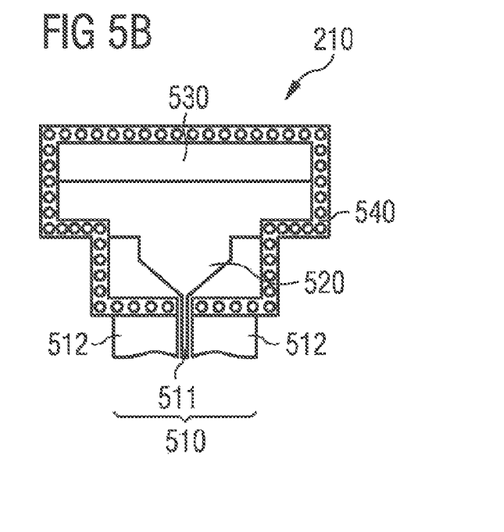

FIGS. 5A and 5B illustrate an exemplary transformer element 210 as may, e.g., be used in the microwave device 200 depicted in FIG. 2. The transformer element 210 may, e.g., be fed by a coplanar microwave transmission line (CTL) 510. A CTL may comprise one central conductor 511 and a pair of return conductors 512 arranged at both sides of the central conductor 511. The CTL 510 may be fabricated in one conductor plane, e.g. by using one structured metallization layer of, e.g., an RDL.

The CTL 510, as illustrated in FIGS. 5A, 5B, is one example of the electrical interconnect 220 as shown in Fig.2. Other examples such as, e.g., microstrip transmission lines implemented in two distinct metal layers of, e.g., a RDL may also be used as electrical interconnect 220. The transformer element 210 may comprise a tapered line structure 520 for mode transformation. The tapered line structure 520 may be connected to the central conductor 511 and may be formed by a structured metal layer. The structured metal layer may form a base plate of the transformer element 210, which partly covers the interior thereof. A residual portion of the interior of the transformer element 210 may be shaped as an opening 530 in the base plate (backside metallization). The base plate (which includes the tapered line structure 520) may further comprise a frame-like structure 540 defining the side walls of the transformer element 210. The electrically conducting side walls may be realized by one or more rows of conductive vias 211 as illustrated in FIGS. 5A and 5B. In other examples, the electrically conducting side walls of the transformer element 210 may be realized by one or more rows of conducting slots or by continuously metallized side walls. As already mentioned, with respect to Fig. 2, the transformer element 210 may either be formed directly in the encapsulant 30 (i.e. the conducting vias 211 are vias running through the encapsulant 30) or in a separate insert which is embedded (e.g. laminated or molded) in the semiconductor package 10 similar and, e.g., concurrently with the microwave semiconductor chip 20. The backside metallization (e.g. the tapered line structure 520, the frame-like structure 540 and the opening 530) may all be realized within a metal layer of an RDL.

It is to be noted that the tapered line structure 520 is only one possibility to transform a TEM mode into a TE mode or vice versa. Other possibilities such as, e.g., a solitary via located in the interior of the transformer element 210 and connected to the central conductor 511 for excitation of the TE waveguide mode are also feasible.

Figure 6:
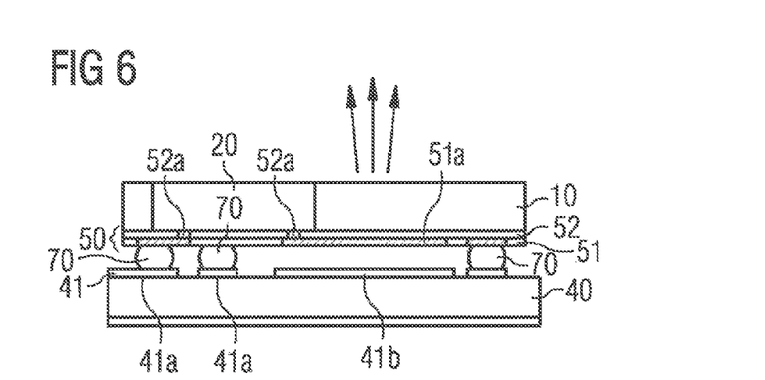
FIG. 6 schematically illustrates a cross-sectional view of an exemplary semiconductor package including a microwave semiconductor chip and an off-chip antenna formed by an electrical redistribution layer (RDL) of the semiconductor package.

FIG. 6 illustrates an exemplary semiconductor package 10 mounted on a carrier 40. The semiconductor package 10 is a WLP package, more specifically an eWLB package. The semiconductor package 10 is equipped with an electrical redistribution structure referred to herein as a RDL (electrical redistribution layer) 50. The RDL 50 may be applied over the bottom surface 10a of the semiconductor package 10. The RDL 50 may, e.g., include one or more structured metallization layer(s) 51 and one or more structured dielectric (or insulating) layer(s) 52.

The dielectric (or insulating) layer 52 of the RDL 50 may include or be of a polymer material (e.g. polyimide, epoxy, silicone, etc.). The dielectric layer 52 may have openings 52a aligned to electrodes (not shown) of the microwave semiconductor chip 20. The metallization layer(s) 51 may be electrically connected through the openings 52a to the microwave semiconductor chip 20. In particular, a structured part 51a of one or more of the metallization layer(s) 51 may be electrically connected to the semiconductor chip 20 and may form an off-chip antenna in the RDL.

The carrier 40 may be a PCB (printed circuit board). As shown in FIG. 6, the semiconductor package 10 may be mounted on the PCB 40 by solder deposits 70. An upper metal layer 41 of the carrier 40 may be structured to provide for conductor traces 41a and, e.g., for a reflector 41b arranged opposite to the off-chip antenna formed in the metallization layer 51.

The arrows in FIG. 6 illustrate, by way of example, the direction of a TX microwave waveguide signal. It is to be noted that it is also possible to have a TX direction of the microwave waveguide signal in the opposite direction, i.e. through the carrier 40, or in a lateral direction. The semiconductor package 10 shown in Fig. 6 may be used as a package in the microwave device 400 of Fig. 4, which uses an off-chip antenna 410. In this case, the waveguide part 60 and the waveguide 61 (see Fig. 4) formed therein is located below or in a lateral direction of the semiconductor package 10. Analogously, the RX direction may, e.g., be the up or down or lateral direction.

It is to be noted that other features explained in conjunction with FIG. 6 (e.g. the WLP package, the RDL 50, the PCB 40, the realization of the antenna in the fan-out area of the package, etc.) may apply to all other microwave devices disclosed herein, in particular to microwave devices 100, 200.

The off-chip antenna manufactured in the RDL 50 of the semiconductor package 10 may, e.g., be a dipole antenna, a coplanar patch (CPW) antenna, an array of two dipole antennas or a so-called Vivaldi antenna. This not only applies to off-chip antennas but also to on-chip antennas as by way of example in microwave device 300 of FIG. 3.

Figure 7:
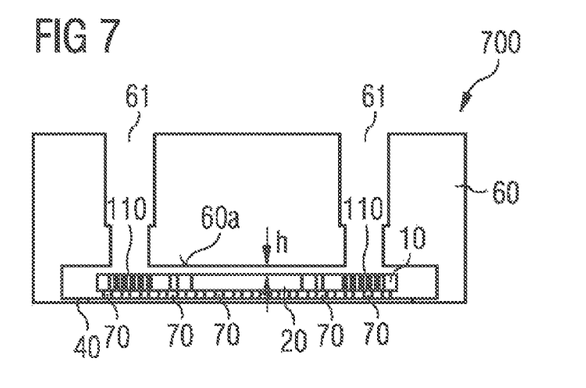
FIG. 7 schematically illustrates a cross-sectional view of an exemplary microwave device including a semiconductor package, a plurality of transformer elements and a waveguide part containing a plurality of waveguides.

FIG. 7 illustrates an exemplary microwave device 700. Microwave device 700 comprises a semiconductor package 10, e.g. a WLP package such as, e.g., an eWLB package, and a waveguide part 60 covering the semiconductor package 10. The microwave device 700 may comprise two or more transformer elements 110, which may, e.g., be similar to transformer elements 210 illustrated in FIG. 2. That is, transformer elements 110 may be embedded in the encapsulant 30 and may provide for two or more "launchers" configured to couple the microwave waveguide signal into corresponding waveguides 60 or vice versa. The transformer elements 110 of microwave device 700 may both be located in the fan-out area of the semiconductor package 10. The transformer elements 110 may be connected to the microwave semiconductor chip 20 by any of the aforementioned microwave transmission lines. The (e.g. integral) waveguide part 60 accommodates two or more waveguides 61 each aligned to the location of a corresponding transformer element 110. Again, only a small or vanishing gap of distance h may be provided between the top surface 10b of the semiconductor package 10 and the bottom surface 60a of the rectangular waveguide part 60. The waveguide part 60 may be mounted on the same carrier 40 on which the semiconductor package 10 is mounted by, e.g., solder deposits 70.

Figure 8:
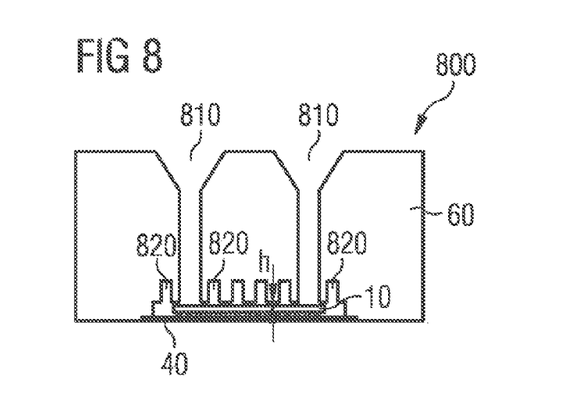
FIG. 8 schematically illustrates a cross-sectional view of an exemplary microwave device including a semiconductor package and a waveguide part containing a plurality of waveguides.

FIG. 8 illustrates an exemplary microwave device 800. Microwave device 800 is similar to microwave device 700, and reference is made to the description above to avoid reiteration. In FIG. 8, by way of example, the (e.g. rectangular) waveguides 61 may further include a microwave component 810. By way of example, the microwave component 810 may be an antenna formed at the outlet portion of the waveguide 61 as shown in Fig. 7 in the waveguide part 60. More specifically, the end portion of the waveguide 61 may have expanding walls providing for, e.g., a horn antenna. Other possibilities of microwave components, which may be included in the waveguide 61, are filters, resonators, power combiners, power dividers, transmission lines, etc.

FIG. 8 further illustrates that the bottom surface of the waveguide part 60 facing the semiconductor package 10 may be provided with a stepped or corrugated surface structure 820. The recesses in the surface contour provide for "traps" which improve the coupling efficiency between the transformer element 110 and the waveguide 61, and which may also improve the isolation between two waveguides 61 (i.e. two channels), if present. The corrugated or crenelated structured 820 or, similarly, a zig-zag-structure 820 may in particular be helpful if the distance h between the waveguide part 60 could not further be decreased for, e.g., thermo-mechanical reasons.

Figure 9:
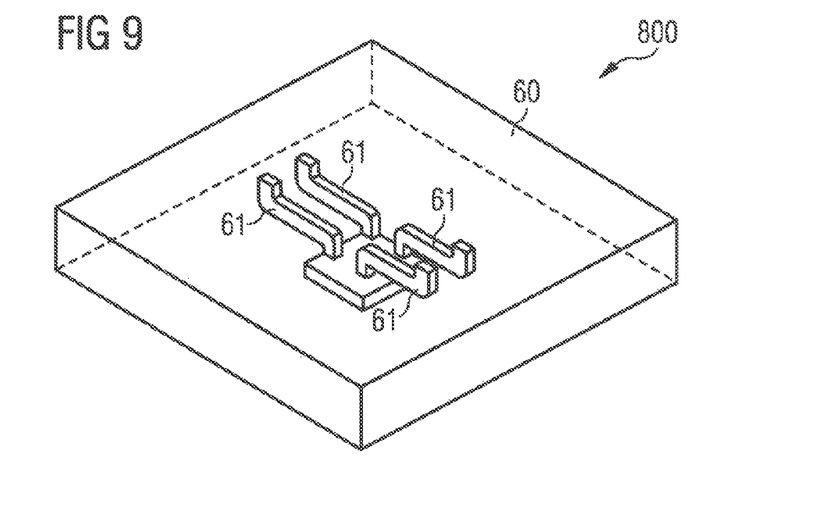
FIG. 9 schematically illustrates a perspective view of an exemplary waveguide part containing a plurality of waveguides.

Referring to FIG. 9, a perspective view of the waveguide part 60 of microwave device 800 is shown. By way of example, the waveguide part 60 may feature a plurality of waveguides 61, e.g. four waveguides 61. The waveguides 61 may have, e.g., a curved run. A curved run or other complex geometries may easily be formed by, e.g., a 3D printing fabrication method. In particular, the waveguide part 60 may be implemented by one integral piece even if a complex geometry of the waveguide(s) 61 or microwave components included in the waveguide(s) 61 is to be created.

Figure 10:
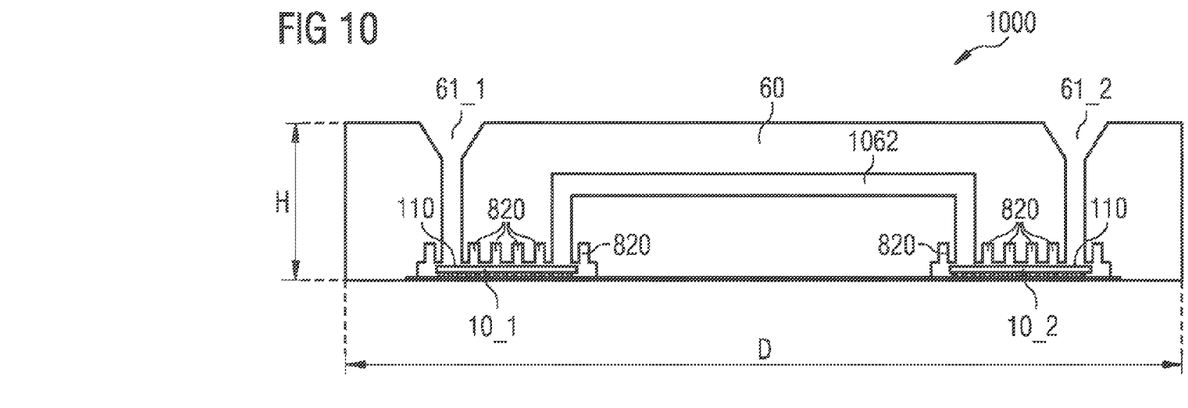
FIG. 10 schematically illustrates a cross-sectional view of an exemplary microwave device including a plurality of semiconductor packages and a waveguide part containing a plurality of waveguides, among them a waveguide which provides for an inter-semiconductor package waveguide connection.

FIG. 10 illustrates an exemplary microwave device 1000. Microwave device 1000 comprises a plurality of semiconductor packages 10_1, 10_2. Each of the plurality of semiconductor packages 10_1, 10_2 may be formed in accordance with the above description of semiconductor package 10. The waveguide part 60 may, e.g., comprise a first waveguide 61_1 associated with the first semiconductor package 10_1 and may comprise a second waveguide 61_2 associated with the second semiconductor package 10_2. The first and second waveguides 61_1 and 61_2 may include microwave components such as, e.g., an antenna (here exemplified as a horn antenna), a filter, a resonator, a power combiner, a power divider, etc.

Further, the waveguide part 60 may be provided with a waveguide 1062 for semiconductor package-to-semiconductor package transition. By way of example, the waveguide 1062 may be shaped as a bridge channel interconnecting a transformer element 110 of the first semiconductor package 10_1 to a transformer element 110 of the second semiconductor package 10_2. It is to be noted that each one of the waveguides 61_1, 61_2 and 1062 is optional, i.e. that the waveguide part 60 may be fabricated with at least only two of these waveguides 61_1, 61_2 and 1062.

The (e.g. rectangular) waveguide 1062 in combination with the implementation of the plurality of semiconductor packages 10_1, 10_2 may provide for a low loss microwave semiconductor chip-to-chip transition. Further, as illustrated in FIG. 10, the coupling of the waveguide part 60 to the semiconductor packages 10_1 and 10_2 may be enhanced by a corrugated bottom surface structure 820 of the waveguide part 60 near the semiconductor packages 10_1, 10_2.

By way of example, the semiconductor packages 10_1, 10_2 may, e.g., have lateral dimensions equal to or less than or greater than 5 mm, 10 mm, 20 mm, 30 mm. The lateral dimension D of the microwave device 1000 may, e.g., be equal to or less than or greater than 5 mm, 10 mm, 20 mm, 30 mm, 40 mm, 50 mm. The height of the semiconductor packages 10_1, 10_2 over the carrier 40 may, e.g., be equal to or less than or greater than 100 µm, 300 µm, 500 µm, 700 µm, 1 mm. The height H of the waveguide part 60 may, e.g., be equal to or less than or greater than 1 mm, 2 mm, 4 mm, 6 mm, 8 mm, 10 mm, or may even be greater.

Figure 11:
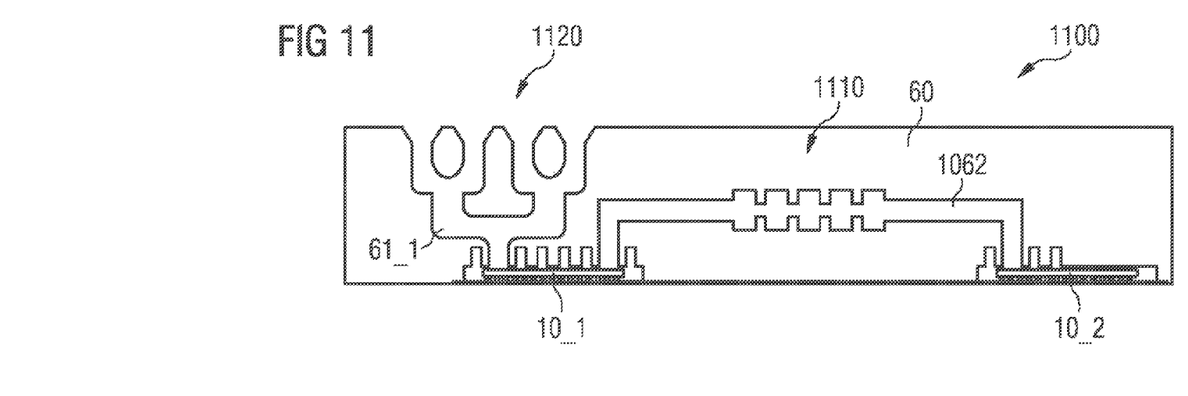
FIG. 11 schematically illustrates a cross-sectional view of an exemplary microwave device including a plurality of semiconductor packages and a waveguide part containing a plurality of waveguides, among them a waveguide which includes a microwave filter component.

FIG. 11 illustrates an example of a microwave device 1100. Microwave device 1100 is similar to microwave device 1000 as shown in FIG. 10 and reference is made to the above description in order to avoid reiteration. In microwave device 1100 the waveguide 1062 is equipped with a passive microwave component 1110, which is, by way of example, exemplified in FIG. 11 as a filter. All other passive microwave components referred to above may be additionally or alternatively be included in the waveguide 1062.

Further, the first (e.g. rectangular) waveguide 61_1 of microwave device 1100 is, e.g., equipped with a horn antenna array 1120 (or any other microwave component). Further, FIG. 11 illustrates by way of example that the second semiconductor package 10_2 of the microwave device 1100 may merely communicate with the first semiconductor package 10_1 via waveguide 1062 and not with any external application, since the waveguide part 60 does, e.g., not include a waveguide (such as waveguide 61_2) from the semiconductor package 10_2 to the environment.

Figure 12:
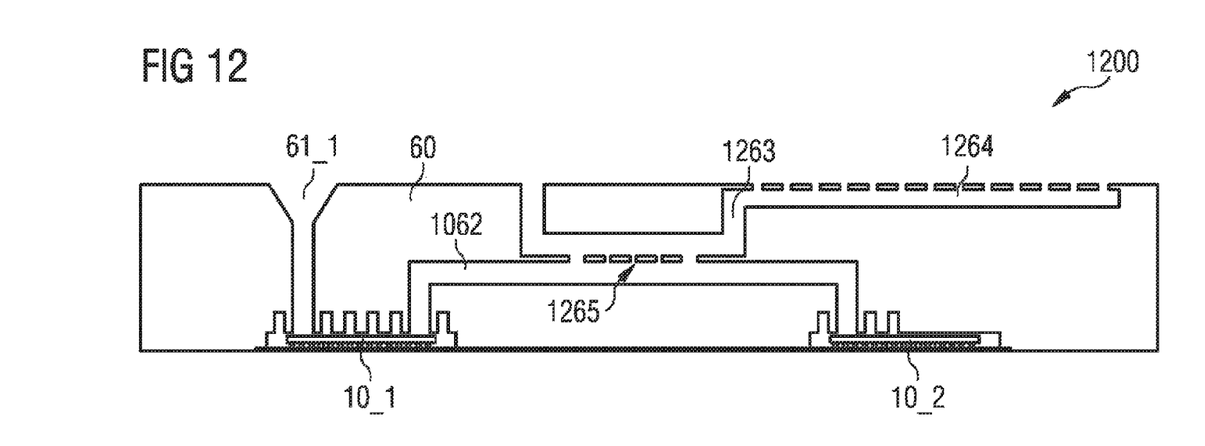
FIG. 12 schematically illustrates a cross-sectional view of an exemplary microwave device including a plurality of semiconductor packages and a waveguide part containing a plurality of waveguides, among them a waveguide antenna connected to an inter-semiconductor package waveguide connection.

FIG. 12 illustrates an exemplary microwave device 1200. Microwave device 1200 may be similar to microwave devices 1000 and 1100 as shown in Figs. 10 and 11, respectively, and reference is made to the above description to avoid reiteration. In microwave device 1200 the waveguide part 60 may comprise another waveguide 1263. The waveguide 1263 may be coupled via waveguide coupler 1265 to another waveguide of waveguide part 60, e.g. to waveguide 1062. The waveguide 1263 may further be equipped with a microwave component such as, e.g., a slotted waveguide antenna array 1264.

Figure 13:
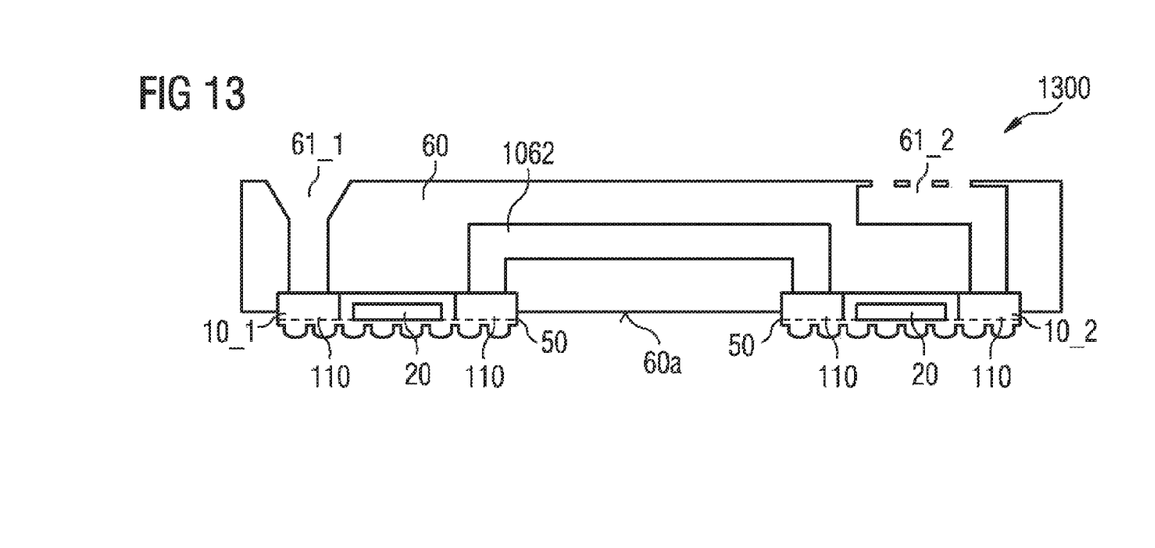
FIG. 13 schematically illustrates a cross-sectional view of an exemplary microwave device including a plurality of semiconductor packages and a waveguide part containing a plurality of waveguides, among them a waveguide which provides for an inter-semiconductor package waveguide connection.

FIG. 13 illustrates a further example of a multi-semiconductor package microwave device 1300. Microwave device 1300 may be similar to microwave devices 1000 to 1200 as shown in Figs. 10 to 12, respectively, and features described in conjunction with these devices may also apply to microwave device 1300 and vice versa. In microwave device 1300 the waveguide 61_1 communicating with the first semiconductor package 10_1 may be configured to include an antenna (e.g. horn antenna) and the waveguide 61_2 communicating with the second semiconductor package 10_2 may be configured to include an antenna (e.g. slotted waveguide antenna array). Again, the shape of the semiconductor packages 10_1 and 10_2 may match the shape of the waveguide part 60 connected to the semiconductor packages 10_1, 10_2. More specifically, as illustrated in FIG. 13, the semiconductor packages 10_1, 10_2 may, e.g., fit into complementary-shaped recesses at the bottom surface 60a of the waveguide part 60 and the waveguides 61_1, 61_2 and 1062 provided in the waveguide part 60 may, e.g., be aligned to the locations of the transformer elements 110 in the semiconductor packages 10_1, 10_2 once the packages are put in place within the recesses.

Figure 14:
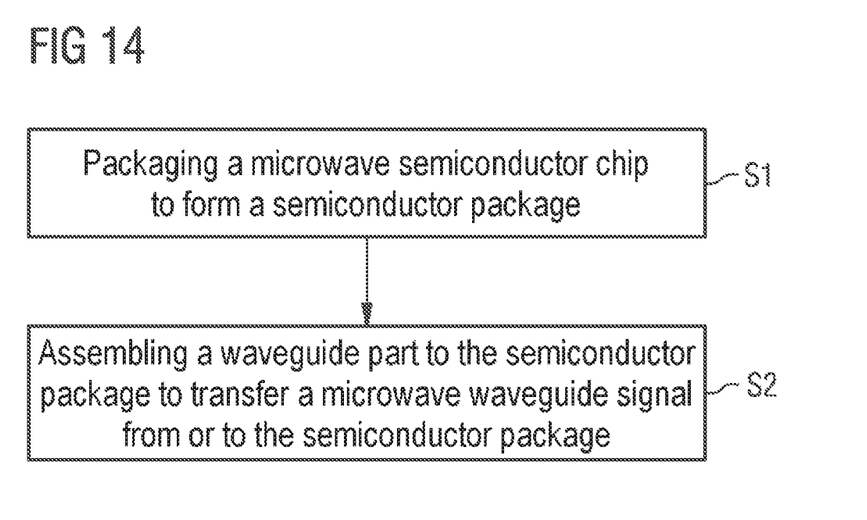
FIG. 14 is a flowchart of an exemplary process for manufacturing a microwave device including a semiconductor chip and a waveguide part by using embedded wafer level packaging (eWLP) technology.

Referring to the flowchart of FIG. 14, a microwave device as described herein may be fabricated using, e.g., WLP or eWLB technology. At S1 a microwave semiconductor chip is packaged to form a semiconductor package. Packaging may comprise embedding a transformer element 110 in an encapsulant 30 and (optionally) providing an RDL 50 to interconnect the microwave semiconductor chip 20 to the transformer element 110.

At S2 a waveguide part 60 comprising one or more pieces is assembled to the semiconductor package 10 to transfer the microwave waveguide signal from or to the semiconductor package 10. As described above, appropriate shaping of the bottom surface 60a of the waveguide part 60 and/or positioning of the waveguide part 60 relative to the semiconductor package 10 may minimize losses at the package-waveguide part transition.

It is to be noted that the waveguide part 60 and the semiconductor package(s) 10 contained in the microwave device may be secured together to form one single module.

In all examples disclosed herein, a very compact and lightweight realization of a microwave device may be obtained, which may be cheap in production. Thus, cheap and fast prototyping is possible by the approach of combining package technology (e.g. WLP technology) with a waveguide part 60 as disclosed herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A microwave device, comprising:
a semiconductor package comprising a microwave semiconductor chip;
one or more plastic pieces connected to the semiconductor package, the one or more plastic pieces forming a waveguide part configured to transfer a microwave waveguide signal; and
a transformer element configured to transform a microwave signal from the microwave semiconductor chip into the microwave waveguide signal for the waveguide part or to transform the microwave waveguide signal from the waveguide part into a microwave signal for the microwave semiconductor chip,
wherein the semiconductor package is an embedded wafer level package, and wherein the microwave semiconductor chip is embedded as an insert in a mold compound or laminate forming an encapsulant of the semiconductor package.

2. The microwave device of claim 1, wherein the one or more plastic pieces are 3D printed plastic parts.

3. The microwave device of claim 1, wherein the waveguide part comprises a microwave component selected from the group consisting of a filter, an antenna, a resonator, a power combiner, and a power divider.

4. The microwave device of claim 1, wherein the waveguide part comprises a wall metallization or is electrically conductive.

5. The microwave device of claim 1, wherein the transformer element is embedded as a further insert in the mold compound or laminate forming the encapsulant of the semiconductor package.

6. The microwave device of claim 1, wherein the waveguide part further comprises a third waveguide.

7. The microwave device of claim 6, wherein the microwave device comprises at least the semiconductor package comprising the microwave semiconductor chip and a second semiconductor package comprising a second microwave semiconductor chip, wherein a first waveguide is associated with the semiconductor package, a second waveguide is associated with the second semiconductor package, and the third waveguide provides for an inter semiconductor package waveguide connection.

8. The microwave device of claim 1, wherein a shape of the semiconductor package fits into a complementary-shaped recess of a surface of the waveguide part.

9. The microwave device of claim 1, wherein the transformer element is an antenna.

10. The microwave device of claim 9, wherein the antenna is an on-chip antenna or an off-chip antenna.

11. The microwave device of claim 1 wherein the transformer element comprises at least one electrically conducting wall structure and is at least partly embedded in the encapsulant.

12. The microwave device of claim 1, wherein the semiconductor package further comprises:
an electrical interconnect comprising a microwave transmission line and configured to electrically couple the semiconductor chip to the transformer element.

13. The microwave device of claim 12, wherein the electrical interconnect is formed by an electrical redistribution layer of the semiconductor package, wherein the electrical redistribution layer extends over a common planar bottom surface of the semiconductor package, and wherein the common planar bottom surface comprises a bottom surface of the microwave semiconductor chip and a bottom surface of the encapsulant.

14. A microwave device, comprising:
a semiconductor package comprising a microwave semiconductor chip;
a 3D printed plastic waveguide part connected to the semiconductor package and configured to transfer a microwave waveguide signal; and
a transformer element configured to transform a microwave signal from the microwave semiconductor chip into the microwave waveguide signal for the waveguide part or to transform the microwave waveguide signal from the waveguide part into a microwave signal for the microwave semiconductor chip,
wherein the semiconductor package is an embedded wafer level package, and wherein the microwave semiconductor chip is embedded as an insert in a mold compound or laminate forming an encapsulant of the semiconductor package.

15. The microwave device of claim 14, wherein the 3D printed plastic waveguide part comprises a passive microwave component shaped by 3D printing.

16. The microwave device of claim 15, wherein the passive microwave component is selected from the group consisting of a filter, an antenna, a resonator, a power combiner, and a power divider.

17. The microwave device of claim 14, wherein the transformer element is embedded as a further insert in the mold compound or laminate forming the encapsulant of the semiconductor package.

18. The microwave device of claim 14, wherein a shape of the semiconductor package fits into a complementary-shaped recess of a surface of the waveguide part.

19. A method of manufacturing a microwave device, comprising:
packaging a microwave semiconductor chip to form a semiconductor package;
forming a waveguide part by 3D printing; and
assembling the waveguide part to the semiconductor package to transfer a microwave waveguide signal from or to the semiconductor package.

20. The method of claim 19, wherein packaging the microwave semiconductor chip comprises:
placing a plurality of microwave semiconductor chips on a temporary carrier;
covering the plurality of microwave semiconductor chips with an encapsulation material to form an encapsulation body; and
separating the encapsulation body into single semiconductor packages each comprising a microwave semiconductor chip.

21. The method of claim 19, further comprising:
depositing a metal layer on a wall of the waveguide part.

22. A microwave device, comprising:
a semiconductor package comprising a microwave semiconductor chip;
one or more plastic pieces connected to the semiconductor package, the one or more plastic pieces forming a waveguide part configured to transfer a microwave waveguide signal; and
a transformer element configured to transform a microwave signal from the microwave semiconductor chip into the microwave waveguide signal for the waveguide part or to transform the microwave waveguide signal from the waveguide part into a microwave signal for the microwave semiconductor chip,
wherein the waveguide part comprises at least a first waveguide and a second waveguide.

* * * * *